(12) United States Patent
Tsunoda et al.

(10) Patent No.: US 9,059,837 B1
(45) Date of Patent: Jun. 16, 2015

(54) CLOCK DATA RECOVERY CIRCUIT AND CLOCK DATA RECOVERY METHOD

(71) Applicant: FUJITSU LIMITED, Kawasaki-shi, Kanagawa (JP)

(72) Inventors: Yukito Tsunoda, Isehara (JP); Takayuki Shibasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/541,197

(22) Filed: Nov. 14, 2014

(30) Foreign Application Priority Data

Jan. 22, 2014 (JP) ................................ 2014-009570

(51) Int. Cl.
*H03D 3/24* (2006.01)
*H04L 7/033* (2006.01)
*H04L 7/00* (2006.01)

(52) U.S. Cl.
CPC .............. *H04L 7/033* (2013.01); *H04L 7/0079* (2013.01)

(58) Field of Classification Search
CPC ....... H03L 7/087; H03L 7/0891; H04L 7/033; H04L 2207/06; H04L 7/191
USPC .................. 375/375, 373, 374, 376; 327/156; 455/103, 127, 307, 325; 331/177 R
See application file for complete search history.

(56) References Cited

U.S. PATENT DOCUMENTS 5,694,088 A    12/1997  Dickson
(Continued)

FOREIGN PATENT DOCUMENTS

| JP | 2000-515337 | 11/2000 |
|---|---|---|
| JP | 2001-217682 | 8/2001 |
| JP | 2002-123332 | 4/2002 |

(Continued)

OTHER PUBLICATIONS

A. Pottbäcker, et al. "A Si Bipolar Phase and Frequency Detector IC for Clock Extraction up to 8 Gb/s", IEEE Journal of Solid-State Circuits, vol. 27, No. 12, pp. 1747-1751, Dec. 1992.
(Continued)

*Primary Examiner* — Khai Tran
(74) *Attorney, Agent, or Firm* — Staas & Halsey LLP

(57) ABSTRACT

A clock data recovery circuit includes: a phase detector circuit configured to generate a phase detection signal indicating a first detection result between a phase of a reception data signal and a phase of a first clock signal; a clock signal generation circuit configured to generate the first clock signal and a second clock signal based on the phase detection signal, the second clock signal having a frequency substantially equal to a frequency of the first clock signal, a phase difference between the first clock signal and the second clock signal being less than 180°; a phase combining circuit configured to combine the first clock signal and the second clock signal in accordance with a phase relation and generate a recovered clock signal; and a recovered data generation circuit configured to sample the reception data signal and generate a recovered data signal based on the recovered clock signal.

17 Claims, 13 Drawing Sheets

(56) References Cited

U.S. PATENT DOCUMENTS

| | | |
|---|---|---|
| 2003/0198105 A1 | 10/2003 | Yamaguchi et al. |
| 2004/0113656 A1 | 6/2004 | Sato |
| 2007/0058768 A1* | 3/2007 | Werner .......................... 375/376 |
| 2008/0238504 A1* | 10/2008 | Kwon ............................ 327/156 |
| 2008/0238628 A1* | 10/2008 | Lam et al. .................... 340/10.3 |
| 2009/0179674 A1 | 7/2009 | Tamura et al. |
| 2011/0221506 A1 | 9/2011 | Tamura et al. |
| 2013/0314142 A1 | 11/2013 | Tamura et al. |
| 2015/0004919 A1* | 1/2015 | Ek ................................... 455/75 |

FOREIGN PATENT DOCUMENTS

| | | |
|---|---|---|
| JP | 2003-309543 | 10/2003 |
| JP | 2004-088693 | 3/2004 |
| WO | WO 98/01952 | 1/1998 |

OTHER PUBLICATIONS

Behzad Razavi "Design of Integrated Circuits for Optical Communications", pp. 217, Sep. 12, 2002.

* cited by examiner

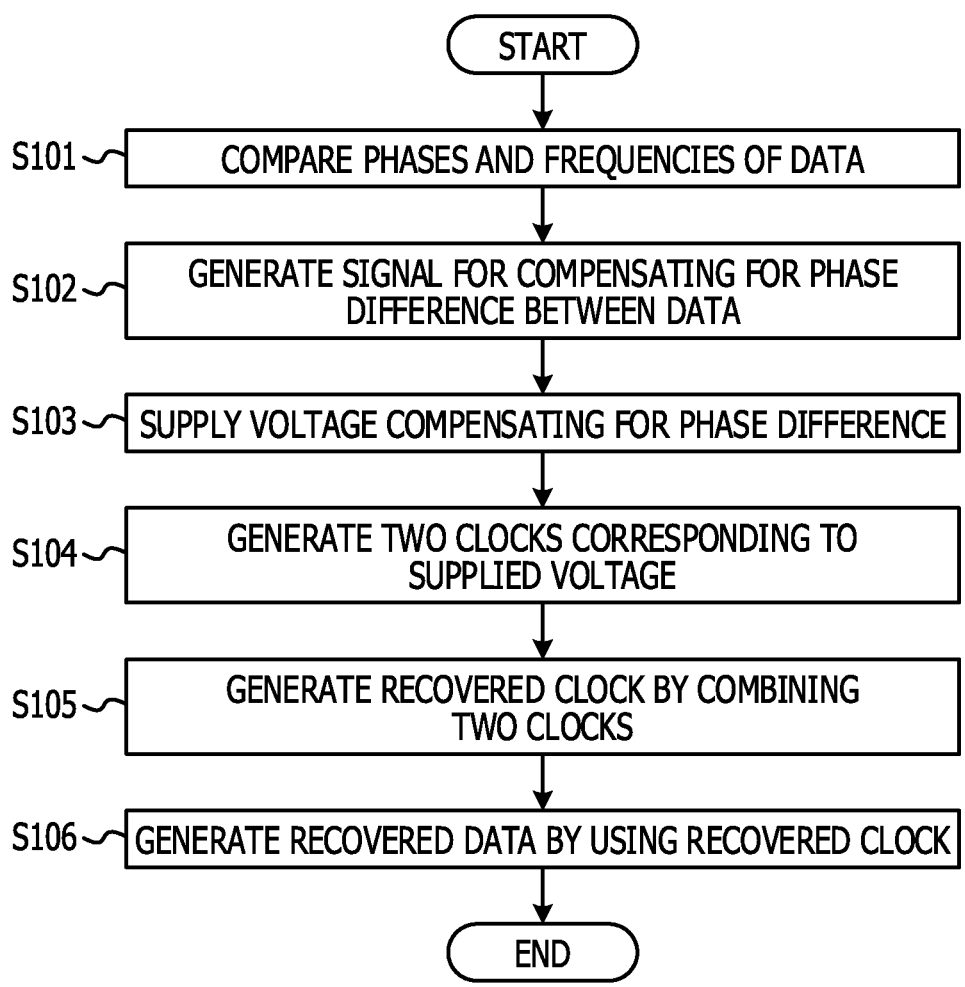

CLOCK DATA RECOVERY CIRCUIT AND CLOCK DATA RECOVERY METHOD

CROSS-REFERENCE TO RELATED APPLICATION

This application is based upon and claims the benefit of priority of the prior Japanese Patent Application No. 2014-009570, filed on Jan. 22, 2014, the entire contents of which are incorporated herein by reference.

FIELD

The embodiments discussed herein are related to a clock data recovery circuit and a clock data recovery method.

BACKGROUND

With improvements in the performance of communication backbone devices or information processing devices such as servers, the communication speed inside and outside devices is increased. In order to recover signals that have degraded in transmission lines, a clock data recovery (CDR) circuit is disposed in a reception circuit that receives signals communicated at high speed.

The related art is disclosed in Japanese National Publication of International Patent Application No. 2000-515337, A. Pottbacker, et al., "A Si bipolar phase and frequency detector IC for clock extraction up to 8 Gb/s", *JSSC*, VOL. 27, NO. 12, pp. 1747-1751, December 1992, or Behzad Razavi, *Design of Integrated Circuits for Optical Communications*, p. 217, Sep. 12, 2002.

SUMMARY

According to an aspect of the embodiments, a clock data recovery circuit includes: a phase detector circuit configured to generate a phase detection signal indicating a first detection result between a phase of a reception data signal and a phase of a first clock signal; a clock signal generation circuit configured to generate the first clock signal and a second clock signal based on the phase detection signal, the second clock signal having a frequency substantially equal to a frequency of the first clock signal, a phase difference between the first clock signal and the second clock signal being less than 180°; a phase combining circuit configured to combine the first clock signal and the second clock signal in accordance with a phase relation and generate a recovered clock signal; and a recovered data generation circuit configured to sample the reception data signal and generate a recovered data signal based on the recovered clock signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an example of clock data recovery processing.

DESCRIPTION OF EMBODIMENTS

A phase/frequency detection circuit detects a phase and a frequency of a data signal by using a first clock signal generated by a voltage-controlled oscillator (VCO) and a second clock signal having a phase that is shifted from the phase of the first clock signal by 90°. A variable delay circuit adds a desired delay amount to a signal in order to adjust the phase of the signal.

In a clock data recovery circuit, a phase of a recovered clock signal generated by the VCO is adjusted using a variable delay circuit. For example, in the case where the phase of the recovered clock signal is adjusted using the variable delay circuit, if a value of an operating temperature or a power supply voltage at the time of adjustment is different from the one at the time of use, the timing of a recovered clock signal that has been adjusted may be shifted because a delay value of the variable delay circuit fluctuates.

Figure 1:
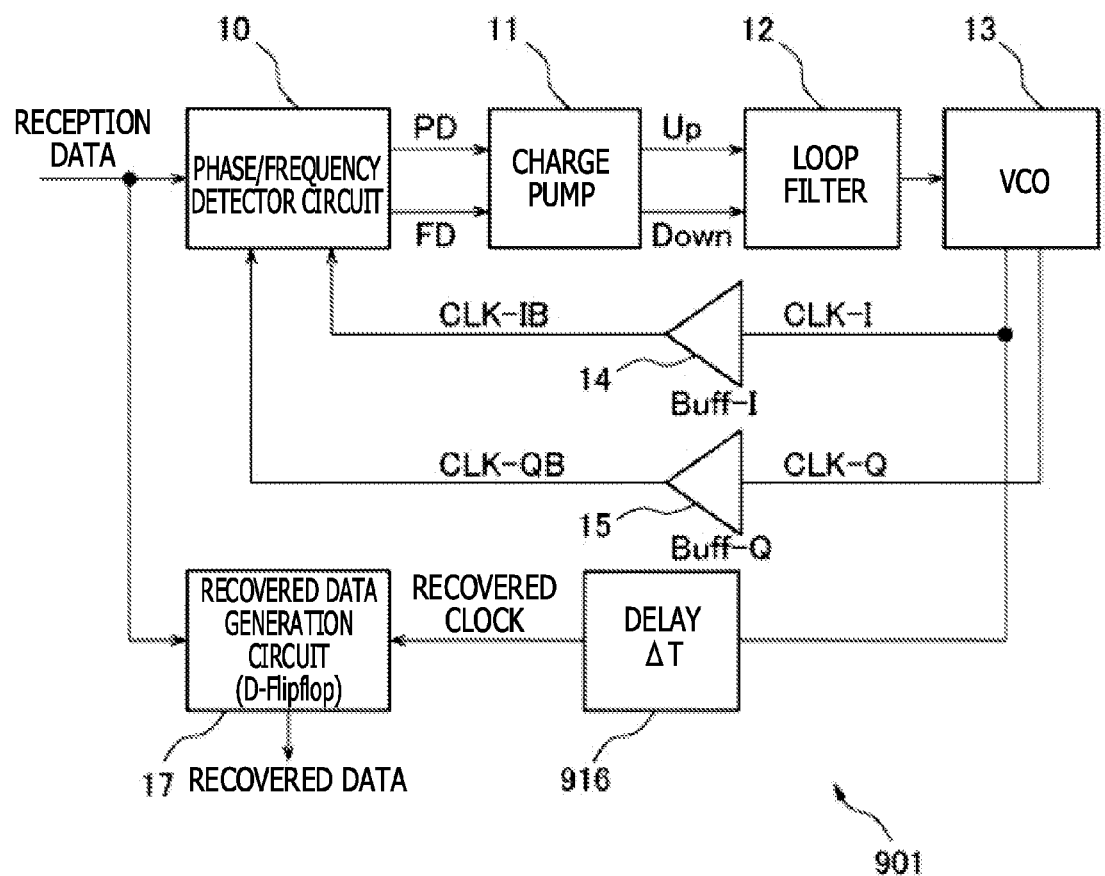
FIG. 1 illustrates an example of a clock data recovery circuit.

FIG. 1 illustrates an example of a clock data recovery circuit.

A clock data recovery circuit 901 includes a phase/frequency detector circuit 10, a charge pump 11, a loop filter 12, a VCO 13, a first clock buffer 14, and a second clock buffer 15. The clock data recovery circuit 901 further includes a delay circuit 916 and a recovered data generation circuit 17.

The phase/frequency detector circuit 10 compares the phases and the frequencies between a reception data signal that represents received data and a first clock signal CLK-IB by using the first clock signal CLK-IB and a second clock signal CLK-QB. The phase/frequency detector circuit 10 generates a phase detection signal PD that represents result of detection between the phase of the reception data signal and the phase of the first clock signal CLK-IB and a frequency detection signal FD that represents result of detection between the frequency of the reception data signal and the frequency of the first clock signal CLK-IB. The phase/frequency detector circuit 10 outputs the generated phase detection signal PD and the generated frequency detection signal FD to the charge pump 11.

The charge pump 11 generates a signal for compensating for the phase difference and the frequency difference between the reception data signal and the first clock signal CLK-IB, by using the phase detection signal PD and the frequency detection signal FD from the phase/frequency detector circuit 10. In the case where the charge pump 11 determines that the first clock signal lags behind the reception data signal or that the frequency of the first clock signal CLK-IB is lower than the frequency of the reception data signal, the charge pump 11 outputs an up signal Up to the loop filter 12. In the case where the charge pump 11 determines that the first clock signal is ahead of the reception data signal or that the frequency of the first clock signal CLK-IB is higher than the frequency of the reception data signal, the charge pump 11 outputs a down signal Down to the loop filter 12.

The loop filter 12 supplies a voltage to the VCO 13. The loop filter 12 changes the voltage to be supplied to the VCO 13 in accordance with the up signal Up or the down signal Down from the charge pump 11. In the case where the loop filter 12 receives the up signal Up from the charge pump 11, the loop filter 12 increases the voltage to be supplied to the VCO 13. In the case where the loop filter 12 receives the down signal Down from the charge pump 11, the loop filter 12 decreases the voltage to be supplied to the VCO 13.

The VCO 13 generates a first clock signal CLK-I having a frequency and a phase corresponding to the voltage supplied by the loop filter 12 and a second clock signal CLK-Q having a phase that lags behind the phase of the first clock signal CLK-I by 90°

The first clock buffer 14 buffers the first clock signal CLK-I generated by the VCO 13 and outputs the first clock signal CLK-I to the phase/frequency detector circuit 10. The second clock buffer 15 buffers the second clock signal CLK-Q generated by the VCO 13 and outputs the second clock signal CLK-Q to the phase/frequency detector circuit 10. The delay amount of the first clock buffer 14 may be substantially equal to the delay amount of the second clock buffer 15.

The delay circuit 916 adjusts the phase of a recovered clock signal that is used by the recovered data generation circuit 17 as a clock signal, by adding a certain delay amount to the first clock signal CLK-I generated by the VCO 13.

The recovered data generation circuit 17 may be a data flip-flop, for example. The recovered data generation circuit 17 samples the reception data signal and generates recovered data from the reception data signal, by using the recovered clock signal, the phase of which has been adjusted by the delay circuit 916.

Figure 2:
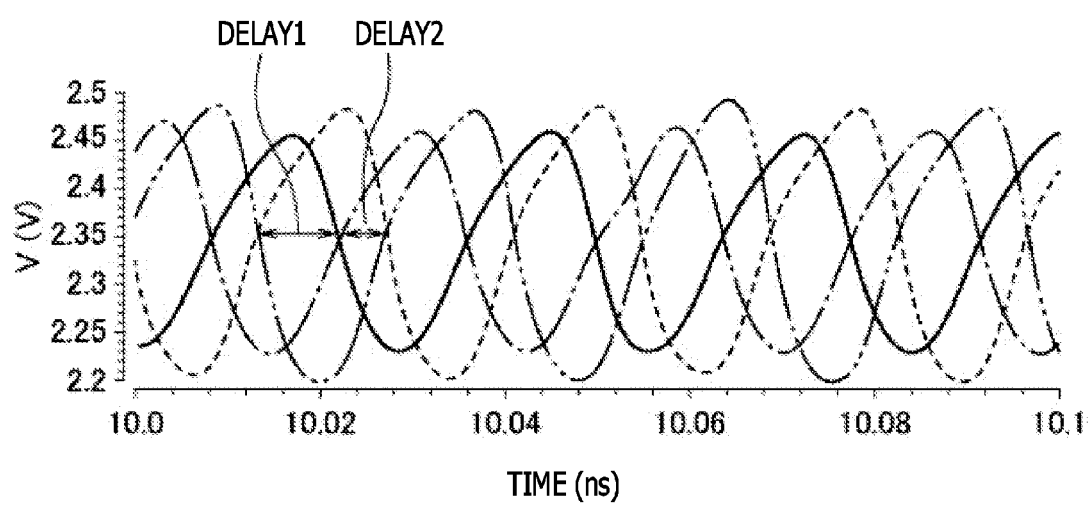
FIG. 2 illustrates an example of a clock signal.

FIG. 2 illustrates an example of a clock signal. FIG. 2 illustrates the waveforms of the first clock signal CLK-I and the second clock signal CLK-Q in the clock data recovery circuit 901 and the waveforms of inverted signals obtained by inverting the first clock signal CLK-I and the second clock signal CLK-Q. In FIG. 2, the horizontal axis represents time and the vertical axis represents the voltage. In FIG. 2, the solid line represents the waveform of the first clock signal CLK-I output from the VCO 13. The dashed line represents the waveform of the second clock signal CLK-Q output from the VCO 13. The long dashed short dashed line represents the waveform of the inverted signal obtained by inverting the first clock signal CLK-I. The long dashed double-short dashed line represents the waveform of the inverted signal obtained by inverting the second clock signal CLK-Q. In FIG. 2, the two-way arrow Delay 1 represents the phase difference between the first clock signal CLK-I and the second clock signal CLK-Q. The two-way arrow Delay 2 represents the phase difference between the second clock signal CLK-Q and the inverted signal obtained by inverting the first clock signal CLK-I.

In the clock data recovery circuit 901, the magnitude of Delay 1 is different from that of the magnitude of Delay 2, and the phase difference between the first clock signal CLK-I and the second clock signal CLK-Q is shifted from 90°. The first clock signal CLK-I generated by the VCO 13 is output to the first clock buffer 14 and the delay circuit 916. The second clock signal CLK-Q generated by the VCO 13 is output only to the second clock buffer 15. In the clock data recovery circuit 901, the magnitude of a load to be driven varies, and therefore, a delay amount in the case where the VCO 13 outputs the first clock signal CLK-I is different from a delay amount in the case where the VCO 13 outputs the second clock signal CLK-Q. If the delay amount of the first clock signal CLK-I is different from the delay amount of the second clock signal CLK-Q, the phase difference between the first clock signal CLK-I and the second clock signal CLK-Q that are output from the VCO 13 is shifted from 90°. If the phase difference between the first clock signal CLK-I and the second clock signal CLK-Q is shifted from 90°, the frequency detection accuracy of the phase/frequency detector circuit 10 may be reduced.

Figure 3A:
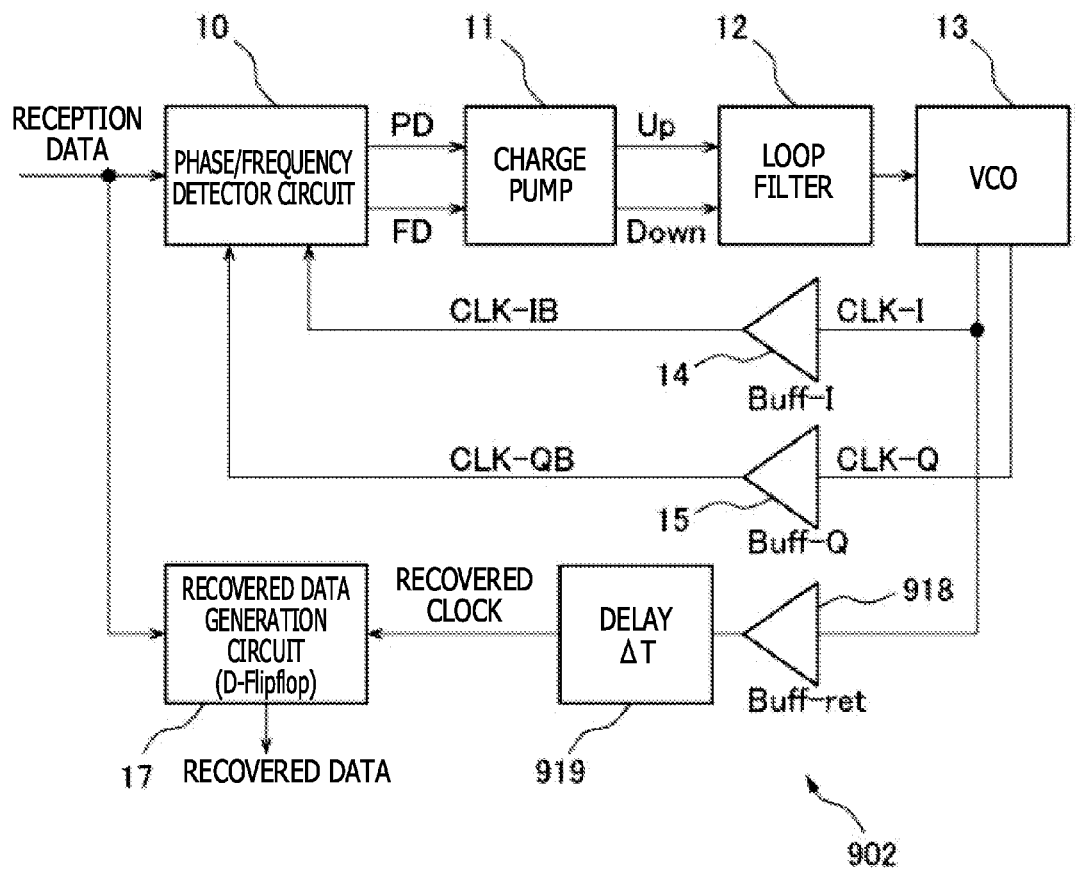
FIG. 3A illustrates an example of a clock data recovery circuit.
Figure 3B:
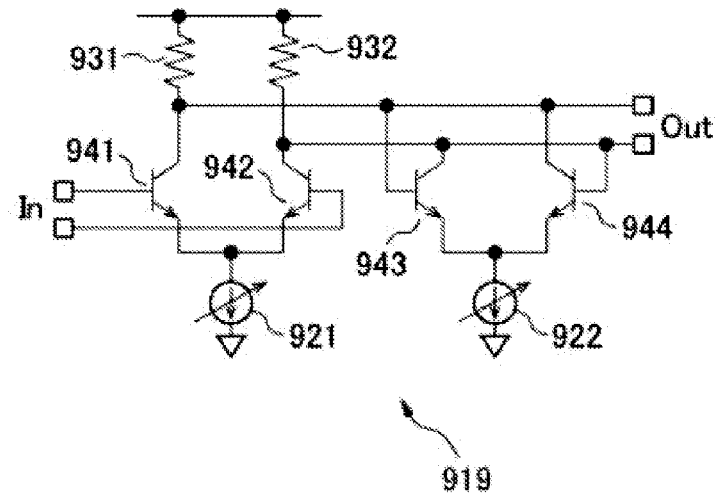
FIG. 3B illustrates an example of a variable delay circuit.

FIG. 3A illustrates an example of a clock data recovery circuit. FIG. 3B illustrates an example of a variable delay circuit. The variable delay circuit illustrated in FIG. 3B may be disposed in the clock data recovery circuit illustrated in FIG. 3A.

A clock data recovery circuit 902 illustrated in FIG. 3A is different from the clock data recovery circuit 901 illustrated in FIG. 1 in that a recovered clock buffer 918 and a variable delay circuit 919 are disposed therein instead of the delay circuit 916.

The recovered clock buffer 918 buffers the first clock signal CLK-I generated by the VCO 13 and outputs the first clock signal CLK-I to the variable delay circuit 919. The delay amount of the recovered clock buffer 918 may be substantially equal to the delay amount of the first clock buffer 14.

The variable delay circuit 919 includes a first current source 921, a second current source 922, a first resistor 931, a second resistor 932, a first transistor 941, a second transistor 942, a third transistor 943, and a fourth transistor 944. One end of the first current source 921 is grounded, and the other end thereof is coupled to the emitter of the first transistor 941 and to the emitter of the second transistor 942. One end of the second current source 922 is grounded, and the other end thereof is coupled to the emitter of the third transistor 943 and the emitter of the fourth transistor 944. One end of the first resistor 931 is coupled to a power supply voltage, and the other end thereof is coupled to the collector of the first transistor 941, the base of the third transistor 943, the collector of the fourth transistor 944, and one end of an output terminal Out. One end of the second resistor 932 is coupled to the power supply voltage, and the other end thereof is coupled to the collector of the second transistor 942, the collector of the third transistor 943, the base of the fourth transistor 944, and the other end of the output terminal Out. The base of the first transistor 941 is coupled to one end of an input terminal In, and the base of the second transistor 942 is coupled to the other end of the input terminal In.

The variable delay circuit 919 adjusts the phase of a recovered clock signal that is used by the recovered data generation circuit 17 as a clock signal, by adding a desired delay amount to the first clock signal CLK-I input to the input terminal In.

Figure 4:
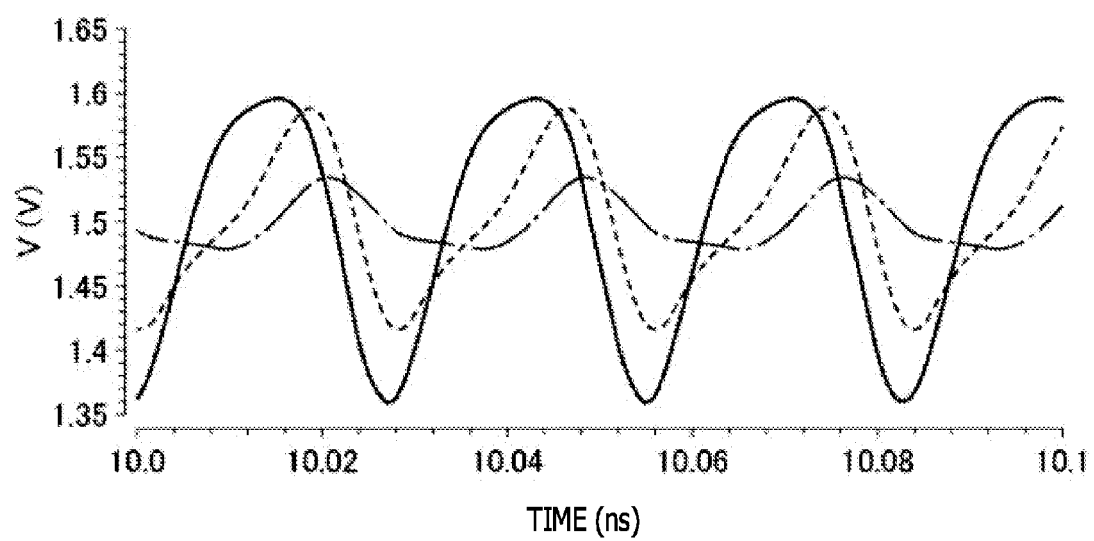
FIG. 4 illustrates an example of a recovered clock.

FIG. 4 illustrates an example of a recovered clock. FIG. 4 illustrates the waveforms of recovered clocks in a case where a delay amount to be added to the clocks is changed in the clock data recovery circuit 902. In FIG. 4, the horizontal axis represents time and the vertical axis represents the voltage. The solid line represents a waveform obtained by adding a first delay amount to the first clock signal CLK-I in the variable delay circuit 919. The dashed line represents a waveform obtained by adding a second delay amount larger than the first delay amount to the first clock signal CLK-I in the variable delay circuit 919. The long dashed short dashed line represents a waveform obtained by adding a third delay amount larger than the second delay amount to the first clock signal CLK-I in the variable delay circuit 919.

In the clock data recovery circuit 902, the amplitude of a recovered clock signal input to the recovered data generation circuit 17 becomes smaller as a delay amount added to the first clock signal CLK-I by the variable delay circuit 919 increases. When the amplitude of a recovered clock signal input to the recovered data generation circuit 17 becomes smaller, the signal recovery performance of the recovered data generation circuit 17 may be degraded.

Figure 5:
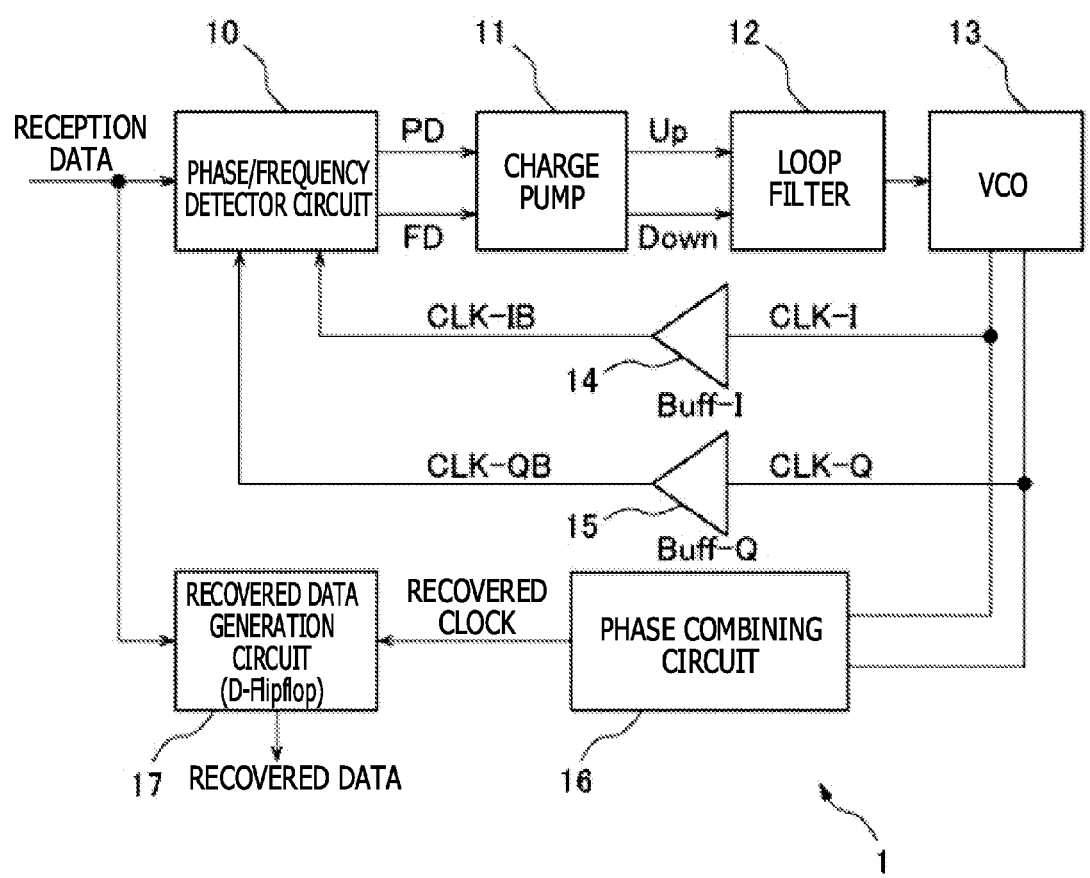
FIG. 5 illustrates an example of a clock data recovery circuit.

FIG. 5 illustrates an example of a clock data recovery circuit.

A clock data recovery circuit 1 illustrated in FIG. 5 is different from the clock data recovery circuit 901 illustrated in FIG. 1 in that a phase combining circuit 16 is disposed instead of the delay circuit 916. In the clock data recovery circuit 1, the first clock signal CLK-I generated by the VCO 13 is output to the first clock buffer 14 and the phase combining circuit 16, and the second clock signal CLK-Q generated by the VCO 13 is output to the second clock buffer 15 and the phase combining circuit 16. A load driven when the VCO 13 outputs the first clock signal CLK-I may be substantially equal to a load driven when the VCO 13 outputs the second clock signal CLK-Q.

Figure 6:
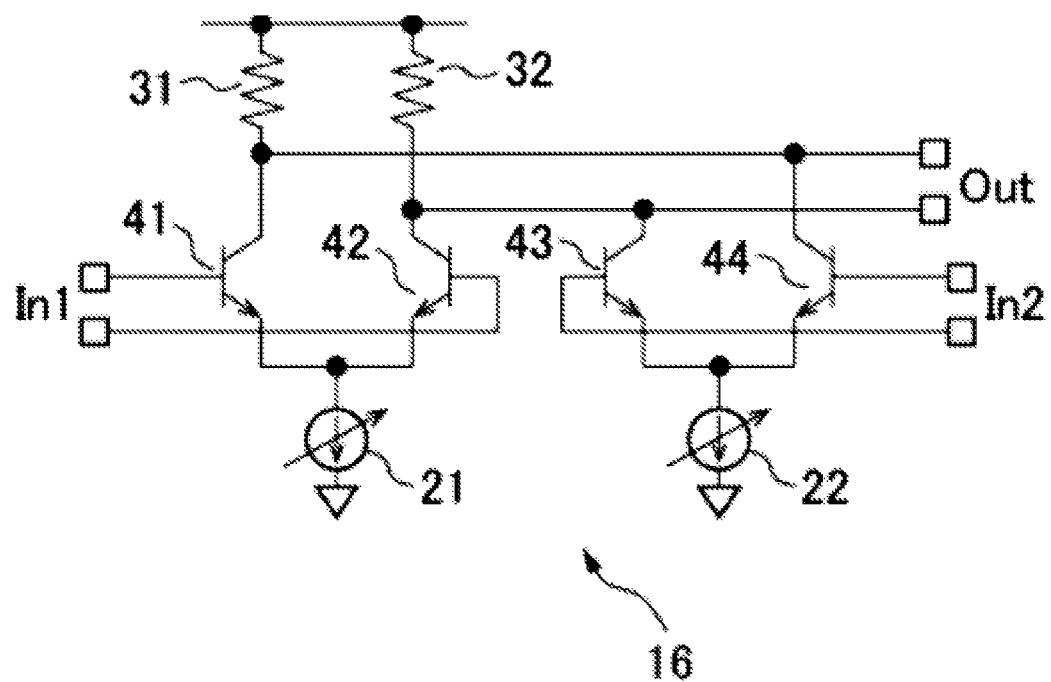
FIG. 6 illustrates an example of a phase combining circuit.

FIG. 6 illustrates an example of a phase combining circuit.

The phase combining circuit 16 includes a first current source 21, a second current source 22, a first resistor 31, a second resistor 32, a first transistor 41, a second transistor 42, a third transistor 43, and a fourth transistor 44. One end of the first current source 21 is grounded, and the other end thereof is coupled to the emitter of the first transistor 41 and the emitter of the second transistor 42. One end of the second current source 22 is grounded, and the other end thereof is coupled to the emitter of the third transistor 43 and the emitter of the fourth transistor 44. One end of the first resistor 31 is coupled to a power supply voltage, and the other end thereof is coupled to the collector of the first transistor 41, the collector of the fourth transistor 44, and one end of an output terminal Out. One end of the second resistor 32 is coupled to the power supply voltage, and the other end thereof is coupled to the collector of the second transistor 42, the collector of the third transistor 43, and the other end of the output terminal Out. The base of the first transistor 41 is coupled to one end of a first input terminal In1, and the base of the second transistor 42 is coupled to the other end of the first input terminal In1. The base of the third transistor 43 is coupled to one end of a second input terminal In2, and the base of the fourth transistor 44 is coupled to the other end of the second input terminal In2.

The first clock signal CLK-I is input to the first input terminal In1 of the phase combining circuit 16, and the second clock signal CLK-Q is input to the second input terminal In2 of the phase combining circuit 16. The phase combining circuit 16 makes the first clock signal CLK-I input to the first input terminal In1 interfere with the second clock signal CLK-Q input to the second input terminal In2 and performs phase adjustment by weighting to thereby generate a recovered clock signal. For example, the phase combining circuit 16 generates a recovered clock signal by combining the first clock signal CLK-I and the second clock signal CLK-Q in accordance with a combination ratio that is determined based on the phases of the first clock signal CLK-I and the second clock signal CLK-Q. The phase combining circuit 16 outputs recovered data obtained by combining the first clock signal CLK-I and the second clock signal CLK-Q in accordance with the phase relation from the output terminal Out, and performs control so that a timing at which the recovered data generation circuit 17 samples reception data becomes optimal.

FIG. 7 illustrates an example of clock data recovery processing. The clock data recovery circuit illustrated in FIG. 5 may perform processing illustrated in FIG. 7.

In operation S101, the phase/frequency detector circuit 10 compares the phase and the frequency of a reception data signal with the phase and the frequency of a first clock signal CLK-IB using the first clock signal CLK-IB and a second clock signal CLK-QB. The phase/frequency detector circuit 10 outputs to the charge pump 11 a phase detection signal PD that represents the result of detection of the phase of the reception data signal with that of the first clock signal CLK-IB, and a frequency detection signal FD that represents the result of detection of the frequency of the reception data signal with that of the first clock signal CLK-IB.

In operation S102, the charge pump 11 generates a signal for compensating for the phase difference and the frequency difference between the reception data signal and the first clock signal CLK-IB, by using the phase detection signal PD and the frequency detection signal FD. The charge pump 11 outputs an up signal UP or a down signal Down in accordance with the phase detection signal PD and the frequency detection signal FD that have been input.

In operation S103, the loop filter 12 supplies to the VCO 13 a voltage which is changed in accordance with the up signal UP or the down signal Down input from the charge pump 11.

In operation S104, the VCO 13 generates a first clock signal CLK-I having a frequency and a phase corresponding to the voltage supplied from the loop filter 12 and a second clock signal CLK-Q having a phase that lags behind the phase of the first clock signal CLK-I by 90°.

In operation S105, the phase combining circuit 16 generates a recovered clock signal by combining the first clock signal CLK-I and the second clock signal CLK-Q generated by the VCO 13 in accordance with the phase relation.

In operation S106, the recovered data generation circuit 17 samples the reception data signal by using the recovered clock signal combined by the phase combining circuit 16 to generate recovered data from the reception data signal.

Figure 8A:
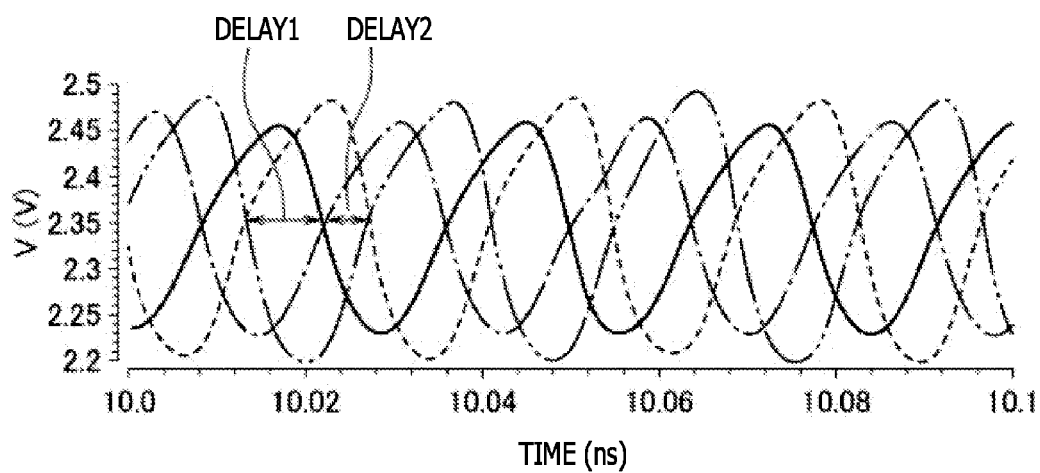
FIGS. 8A and 8B illustrate an example of a clock signal.
Figure 8B:
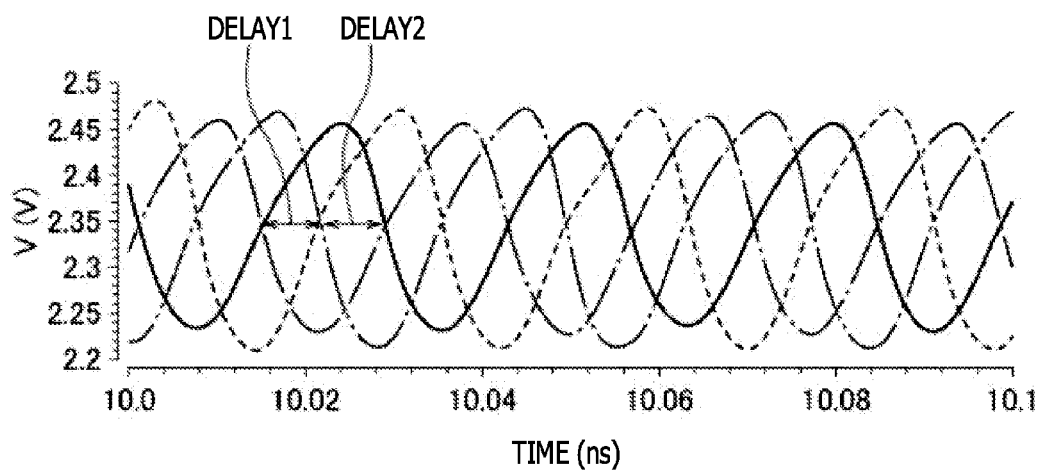

FIGS. 8A and 8B illustrate an example of a clock signal. FIG. 8A illustrates the waveforms of the first clock signal CLK-I and the second clock signal CLK-Q in the clock data recovery circuit 901 illustrated in FIG. 1 and the waveforms of inverted signals obtained by inverting the first clock signal CLK-I and the second clock signal CLK-Q. FIG. 8B illustrates the waveforms of the first clock signal CLK-I and the second clock signal CLK-Q in the clock data recovery circuit 1 illustrated in FIG. 5 and the waveforms of inverted signals obtained by inverting the first clock signal CLK-I and the second clock signal CLK-Q. In FIGS. 8A and 8B, the horizontal axis represents time and the vertical axis represents the voltage. In FIGS. 8A and 8B, the solid line represents the waveform of the first clock signal CLK-I output from the VCO 13. The dashed line represents the waveform of the second clock signal CLK-Q output from the VCO 13. The long dashed short dashed line represents the waveform of the inverted signal obtained by inverting the first clock signal CLK-I. The long dashed double-short dashed line represents the waveform of the inverted signal obtained by inverting the second clock signal CLK-Q. The two-way arrow Delay 1 represents the phase difference between the first clock signal CLK-I and the second clock signal CLK-Q. The two-way arrow Delay 2 represents the phase difference between the second clock signal CLK-Q and the inverted signal obtained by inverting the first clock signal CLK-I.

In the clock data recovery circuit 901 illustrated in FIG. 1, the magnitude of a load that is driven varies, and therefore, the delay amount of the first clock signal CLK-I is different from the delay amount of the second clock signal CLK-Q. In the clock data recovery circuit 1 illustrated in FIG. 5, a load driven when the first clock signal CLK-I is output is substantially equal to a load driven when the second clock signal CLK-Q is output, and therefore, the delay amount of the first clock signal CLK-I may be substantially equal to the delay amount of the second clock signal CLK-Q. In the clock data recovery circuit 1, the delay amount of the first clock signal CLK-I may be substantially equal to the delay amount of the second clock signal CLK-Q, and the phase difference between the first clock signal CLK-IB and the second clock signal CLK-QB that are input to the phase/frequency detector circuit 10 may be substantially 90°. In the clock data recovery circuit 1, the phase difference between the first clock signal CLK-IB and the second clock signal CLK-QB that are input to the phase/frequency detector circuit 10 is substantially maintained at 90°, and therefore, the reduction in the frequency detection accuracy of the phase/frequency detector circuit 10 may be suppressed.

Figure 9A:
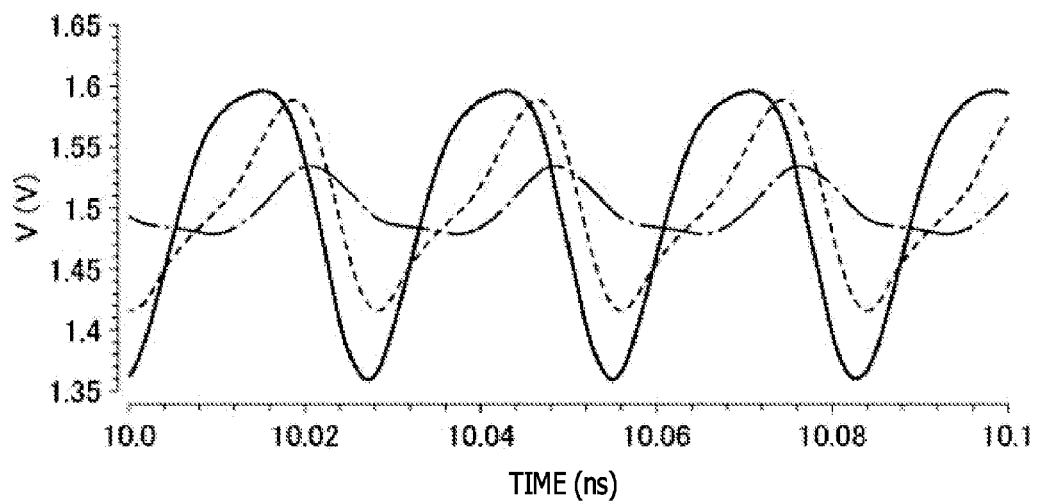
FIGS. 9A and 9B illustrate an example of a recovered clock.
Figure 9B:
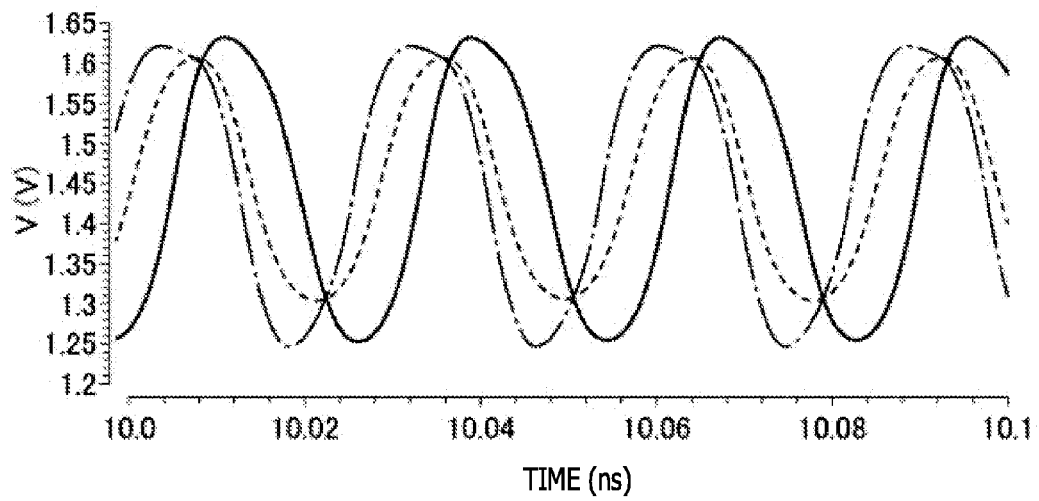

FIGS. 9A and 9B illustrate an examples of a recovered clock. FIG. 9A illustrates the waveforms of recovered clocks obtained by changing a delay amount to be added in the clock data recovery circuit 902 illustrated in FIG. 3A. FIG. 9B illustrates the waveforms of recovered clocks obtained by changing a delay amount to be added in the clock data recovery circuit 1 illustrated in FIG. 5. In FIGS. 9A and 9B, the horizontal axis represents time and the vertical axis represents the voltage. In FIGS. 9A and 9B, the solid lines represent waveforms obtained by adding a first delay amount to the first clock signal CLK-I by the variable delay circuit 919 and by the phase combining circuit 16 respectively. The dashed lines represent waveforms obtained by adding a second delay amount larger than the first delay amount to the first clock signal CLK-I by the variable delay circuit 919 and by the phase combining circuit 16 respectively. The long dashed short dashed lines represent waveforms obtained by adding a third delay amount larger than the second delay amount to the first clock signal CLK-I by the variable delay circuit 919 and by the phase combining circuit 16 respectively.

In the clock data recovery circuit 902, the amplitude of a recovered clock signal input to the recovered data generation circuit 17 decreases as a delay amount that is added to the first clock signal CLK-I by the variable delay circuit 919 increases. In the clock data recovery circuit 1, the ratio of a decrease in the amplitude of a recovered clock signal input to the recovered data generation circuit 17 when a delay amount to be added to the first clock signal CLK-I by the variable delay circuit 919 increases is small. In the clock data recovery circuit 1, the ratio of a decrease in the amplitude of a recovered clock signal input to the recovered data generation circuit 17 is small, and therefore, the degradation of the signal recovery performance of the recovered data generation circuit 17 may be suppressed.

In the clock data recovery circuit 1, by adding the phase combining circuit 16, both an effect of making a load driven when outputting the first clock signal CLK-1 equal to a load driven when outputting the second clock signal CLK-Q and an effect of performing optimal adjustment of a delay amount by combining phases may be attained. Accordingly, an increase in the size of the circuit and an increase in power consumption associated with the increase in the size of the circuit may be suppressed.

Figure 10:
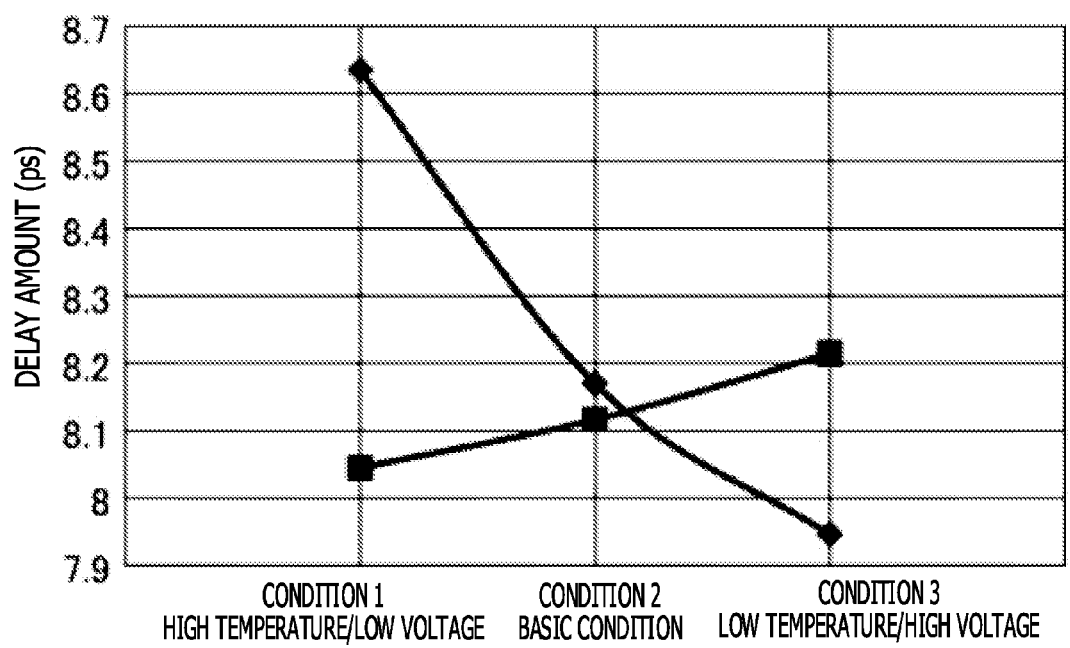
FIG. 10 illustrates an example of a dependence of a delay amount on temperature and power supply voltage.

FIG. 10 illustrates an example of a dependence of a delay amount on temperature and power supply voltage. In FIG. 10, the dependence of a delay amount on temperature and power supply voltage, the delay amount being added by the phase combining circuit 16 of the clock data recovery circuit 1 illustrated in FIG. 5 and the dependence of a delay amount on temperature and power supply voltage, the delay amount being added by the recovered clock buffer 918 and the variable delay circuit 919 of the clock data recovery circuit 902 illustrated in FIG. 3A, are illustrated. In FIG. 10, the horizontal axis represents temperature conditions and power supply voltage conditions, and the vertical axis represents a delay amount that is added. In FIG. 10, each small square represents a delay amount added by the phase combining circuit 16 of the clock data recovery circuit 1, and each small rhombus represents a delay amount added by the variable delay circuit 919 of the clock data recovery circuit 902.

A change in a delay amount added by the phase combining circuit 16 of the clock data recovery circuit 1, the change being associated with variations in the temperature condition and the power supply voltage condition, is smaller than a change in a delay amount added by the recovered clock buffer 918 and the variable delay circuit 919 of the clock data recovery circuit 902. A delay amount added by the recovered clock buffer 918 and the variable delay circuit 919 is specified based on the operation speeds of a plurality of transistors included in each of the recovered clock buffer 918 and the variable delay circuit 919, and therefore, the delay amount largely varies in association with variations in the temperature condition and the power supply voltage condition. A delay amount added by the phase combining circuit 16 of the clock data recovery circuit 1 is specified based on the phase relation between the first clock signal CLK-I and the second clock signal CLK-Q. Even in the case where the frequencies of the first clock signal CLK-I and the second clock signal CLK-Q change in association with variations in the temperature condition and the power supply voltage condition, the phase relation between the first clock signal CLK-I and the second clock signal CLK-Q might not change. This also affects a recovered clock signal that is a clock signal obtained by combining the phases of the first clock signal CLK-I and the second clock signal CLK-Q. A change in the phase relation of the recovered clock signal relative to the first clock signal CLK-I and the second clock signal CLK-Q may be suppressed, and a change amount associated with variations in the temperature condition and the power supply voltage condition may be small.

Figure 11:
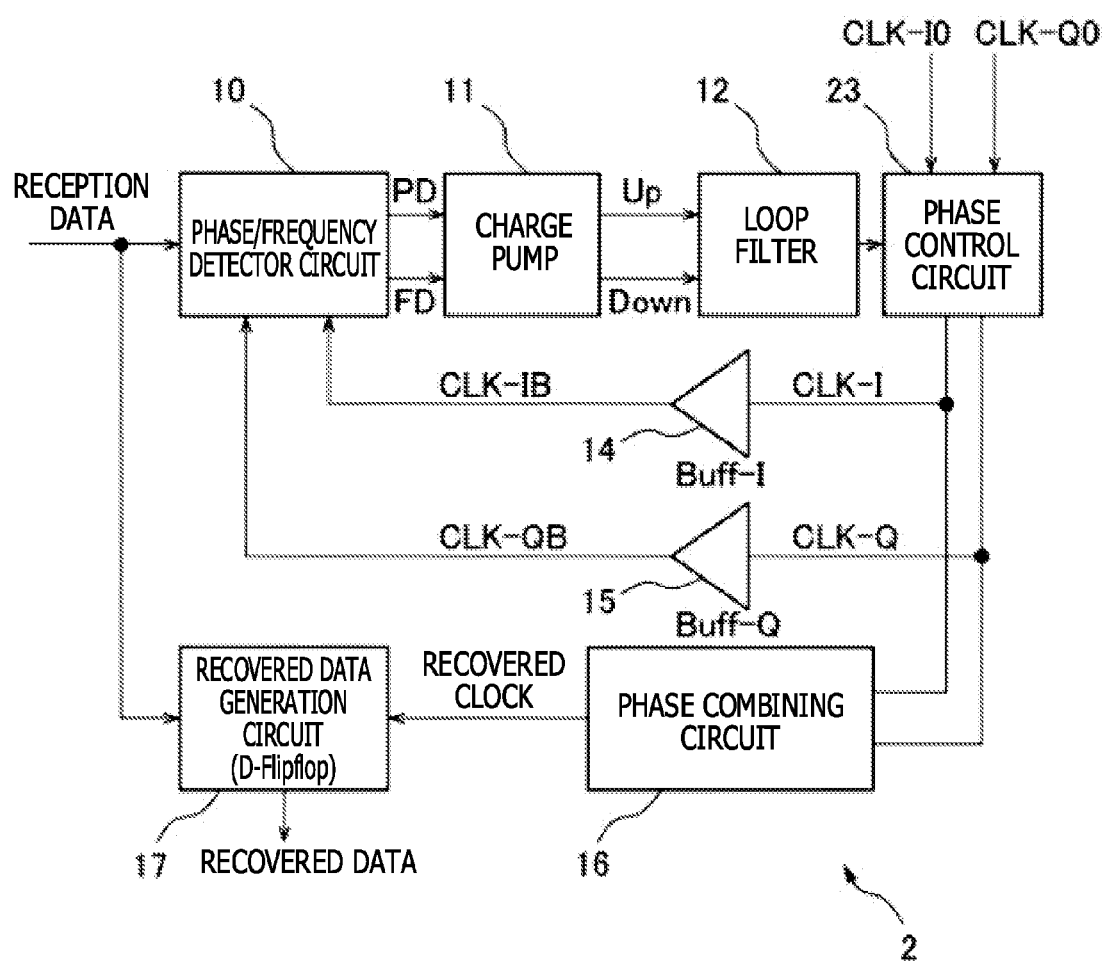
FIG. 11 illustrates an example of a clock data recovery circuit.

FIG. 11 illustrates an example of a clock data recovery circuit.

A clock data recovery circuit 2 illustrated in FIG. 11 is different from the clock data recovery circuit 1 illustrated in FIG. 5 in that a phase control circuit 23 is disposed instead of the VCO 13. The phase control circuit 23 combines a first input clock signal CLK-I0 and a second input clock signal CLK-Q0 in accordance with a combination ratio based on a voltage supplied by the loop filter 12, and generates the first clock signal CLK-I and the second clock signal CLK-Q.

Figure 12:
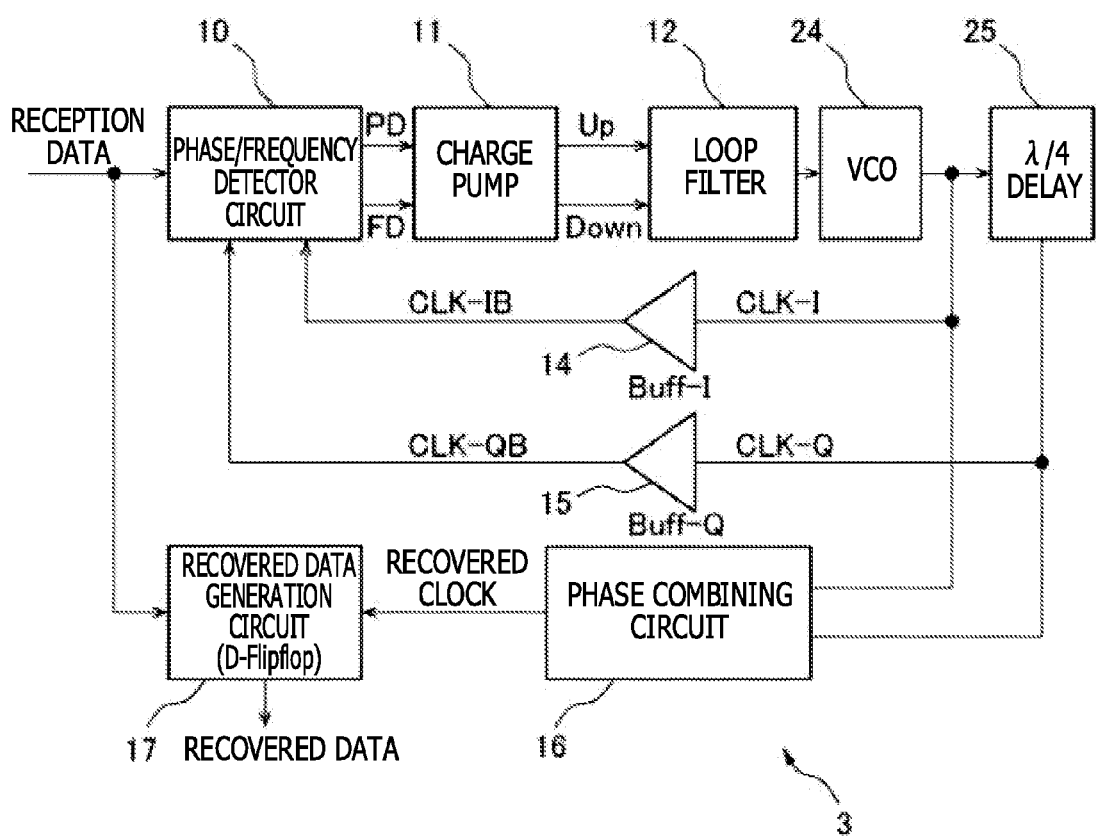
FIG. 12 illustrates an example of a clock data recovery circuit.

FIG. 12 illustrates an example of a clock data recovery circuit.

A clock data recovery circuit 3 illustrated in FIG. 12 is different from the CDR circuit 1 illustrated in FIG. 5 in that a VCO 24 and a ¼ wavelength delay circuit 25 are disposed instead of the VCO 13. The VCO 24 generates the first clock signal CLK-I that has a frequency and a phase corresponding to a voltage supplied by the loop filter 12. The ¼ wavelength delay circuit 25 generates the second clock signal CLK-Q having the phase which lags behind the phase of the first clock signal CLK-I by 90°, by delaying the first clock signal CLK-I by a quarter wavelength.

Figure 13:
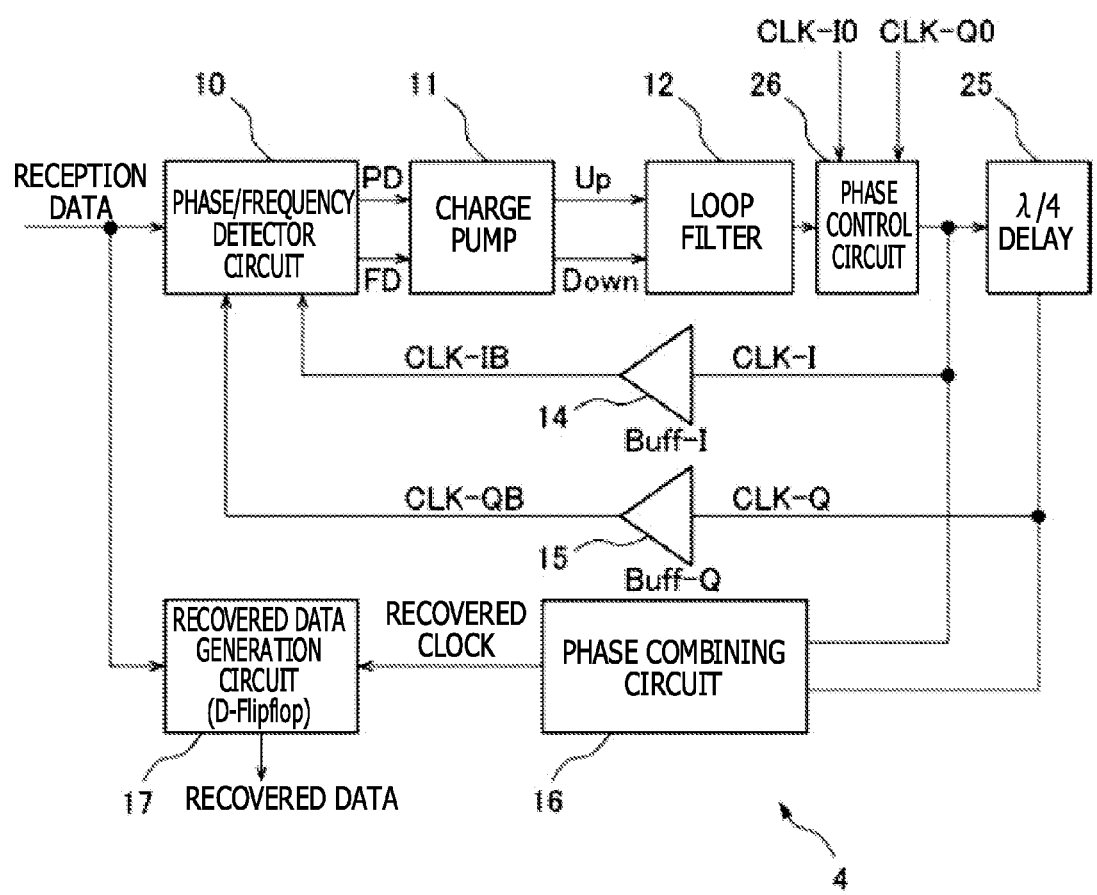
FIG. 13 illustrates an example of a clock data recovery circuit.

FIG. 13 illustrates an example of a clock data recovery circuit.

A clock data recovery circuit 4 illustrated in FIG. 13 is different from the clock data recovery circuit 1 illustrated in FIG. 5 in that a phase control circuit 26 and the ¼ wavelength delay circuit 25 are disposed instead of the VCO 13. The phase control circuit 26 combines the first input clock signal CLK-10 and the second input clock signal CLK-Q0 in accordance with a combination ratio based on a voltage supplied by the loop filter 12, and generates the first clock signal CLK-I. The ¼ wavelength delay circuit 25 generates the second clock signal CLK-Q having the phase which lags behind the phase of the first clock signal CLK-I by 90°, by delaying the first clock signal CLK-I by a quarter wavelength.

In the clock data recovery circuits 1 to 4, the phase relation between the first clock signal and the second clock signal might not change even in the case where the temperature condition and the power supply voltage condition vary. This also affects a recovered clock signal that is a clock signal obtained by combining the phases of the first clock signal CLK-I and the second clock signal CLK-Q. Accordingly, a change in the phase relation of the recovered clock signal relative to the first clock signal CLK-I and the second clock signal CLK-Q may be suppressed, and a change in the delay amount of the phase combining circuit 16 associated with variations in the temperature condition and the power supply voltage condition may be small.

In the clock data recovery circuits 1 to 4, the phase difference between the first clock signal and the second clock signal that are input to the phase/frequency detector circuit 10 is maintained at 90°, and therefore, the reduction in the frequency detection accuracy of the phase/frequency detector circuit 10 may be suppressed.

In the clock data recovery circuits 1 to 4, the ratio of a decrease in the amplitude of a recovered clock signal input to the recovered data generation circuit 17 is small, and therefore, the degradation of the signal recovery performance of the recovered data generation circuit 17 may be suppressed.

In the clock data recovery circuits 1 to 4, a voltage supplied to the VCO is controlled by using both of the phase detection signal PD and the frequency detection signal FD which are generated by the phase/frequency detector circuit 10, and therefore, a recovered clock signal is generated promptly with a high accuracy. For example, in the case where a recovered data signal is generated by using a recovered clock signal generated by only using the phase detection signal PD, a phase detector circuit that generates only the phase detection signal PD may be disposed instead of the phase/frequency detector circuit 10. In the case where a phase detector circuit is disposed instead of the phase/frequency detector circuit 10, the phase detector circuit may generate the phase detection signal PD by using one of the first clock signal CLK-I and the second clock signal CLK-Q.

In the clock data recovery circuits 1 to 4, the phase difference between the phase of the first clock signal CLK-I and the phase of the second clock signal CLK-Q which are input to the phase combining circuit 16, may be 90°. For example, in the case where the second clock signal input to the phase combining circuit 16 has a frequency that is substantially equal to the frequency of the first clock signal and the phase difference between the second clock signal and the first clock signal is closer to 90°, a larger effect may be attained. The phase difference may be larger than 0° and less than 180°.

In the clock data recovery circuit 1, the VCO 13 that outputs two clock signals having the phases which differ by 90° is disposed. For example, a VCO that outputs four clock signals having the phases which differ from one another by 90° may be disposed instead of the VCO 13.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock data recovery circuit comprising:
   a phase detector circuit configured to generate a phase detection signal indicating a first detection result between a phase of a reception data signal and a phase of a first clock signal;
   a clock signal generation circuit configured to generate the first clock signal and a second clock signal based on the phase detection signal, the second clock signal having a frequency substantially equal to a frequency of the first clock signal, a phase difference between the first clock signal and the second clock signal being less than 180°;
   a phase combining circuit configured to combine the first clock signal and the second clock signal in accordance with a phase relation and generate a recovered clock signal; and
   a recovered data generation circuit configured to sample the reception data signal and generate a recovered data signal based on the recovered clock signal.

2. The clock data recovery circuit according to claim 1, wherein
   the phase detector circuit generates a frequency detection signal indicating a second detection result between a frequency of the reception data signal and the frequency of the first clock signal based on the first clock signal and the second clock signal, and
   the clock signal generation circuit generates the first clock signal and the second clock signal based on the phase detection signal and the frequency detection signal.

3. The clock data recovery circuit according to claim 1, wherein
   the phase combining circuit generates the recovered clock signal by combining the first clock signal and the second clock signal based on a combination ratio that is determined based on the phase of the first clock signal and a phase of the second clock signal.

4. The clock data recovery circuit according to claim 1, wherein
   a duty ratio of the first clock signal and the second clock signal is 50%.

5. The clock data recovery circuit according to claim 1, wherein
   the phase difference between the first clock signal and the second clock signal is 90°.

6. The clock data recovery circuit according to claim 1, wherein
   the clock signal generation circuit includes an oscillation circuit that generates the first clock signal and the second clock signal.

7. The clock data recovery circuit according to claim 1, wherein
   the clock signal generation circuit generates the first clock signal and the second clock signal by combining two clock signals, the two clock signals having an identical frequency, a phase difference between the two clock signals being less than 180°.

8. The clock data recovery circuit according to claim 1, wherein
the second clock signal is generated by delaying the first clock signal.

9. The clock data recovery circuit according to claim 1, wherein
the phase combining circuit includes
a first differential pair configured to receive the first clock signal, and
a second differential pair configured to receive the second clock signal.

10. The clock data recovery circuit according to claim 9, wherein
the first differential pair is coupled between a first load and a first current source, and
the second differential pair is coupled between a second load and a second current source.

11. A clock data recovery method comprising:
generating a phase detection signal by comparing a phase of a reception data signal and a phase of a first clock signal using a phase detector circuit;
generating the first clock signal and a second clock signal based on the phase detection signal, the second clock signal having a frequency substantially equal to a frequency of the first clock signal, a phase difference between the first clock signal and the second clock signal being less than 180°;
combining the first clock signal and the second clock signal in accordance with a phase relation to generate a recovered clock signal; and
sampling the reception data signal to generate a recovered data signal by using the recovered clock signal.

12. The clock data recovery method according to claim 11, further comprising:
generating a frequency detection signal by comparing a frequency of the reception data signal and the frequency of the first clock signal by using the first clock signal and the second clock signal; and
generating the first clock signal and the second clock signal based on the phase detection signal and the frequency detection signal.

13. The clock data recovery method according to claim 11, further comprising:
combining the first clock signal and the second clock signal based on a combination ratio that is determined based on the phase of the first clock signal and a phase of the second clock signal.

14. The clock data recovery method according to claim 11, wherein
a duty ratio of the first clock signal and the second clock signal is 50%.

15. The clock data recovery method according to claim 11, wherein
the phase difference between the first clock signal and the second clock signal is 90°.

16. The clock data recovery method according to claim 11, further comprising:
combining two clock signals having an identical frequency, a phase difference between the two clock signals being less than 180° to generate the first clock signal and the second clock signal by.

17. The clock data recovery method according to claim 11, further comprising:
delaying the first clock signal to generate the second clock signal.

* * * * *

UNITED STATES PATENT AND TRADEMARK OFFICE
CERTIFICATE OF CORRECTION

PATENT NO.        : 9,059,837 B1
APPLICATION NO.   : 14/541197
DATED             : June 16, 2015
INVENTOR(S)       : Yukito Tsunoda et al.

Page 1 of 1

It is certified that error appears in the above-identified patent and that said Letters Patent is hereby corrected as shown below:

In the Claims

Column 12, Line 29, In Claim 16, delete "signal by." and insert -- signal. --, therefor.

Signed and Sealed this
Thirteenth Day of October, 2015

Michelle K. Lee
*Director of the United States Patent and Trademark Office*